US009069025B2

(12) United States Patent
Schaefer et al.

(10) Patent No.: US 9,069,025 B2
(45) Date of Patent: Jun. 30, 2015

(54) METHOD AND DEVICE FOR MONITORING THE INSULATION OF UNGROUNDED DC AND AC VOLTAGE NETWORKS

(75) Inventors: Oliver Schaefer, Gruenberg (DE); Karl Schepp, Reiskirchen (DE)

(73) Assignee: Bender GmbH & Co. KG, Gruenberg (DE)

( * ) Notice: Subject to any disclaimer, the term of this patent is extended or adjusted under 35 U.S.C. 154(b) by 737 days.

(21) Appl. No.: 13/305,182

(22) Filed: Nov. 28, 2011

(65) Prior Publication Data

US 2012/0126839 A1    May 24, 2012

Related U.S. Application Data

(63) Continuation-in-part of application No. PCT/EP2010/055553, filed on Apr. 26, 2010.

(30) Foreign Application Priority Data

May 27, 2009  (EP) .................................... 09161290

(51) Int. Cl.
  *G01R 31/02*  (2006.01)
  *G01R 27/18*  (2006.01)
  *G01R 27/02*  (2006.01)

(52) U.S. Cl.
  CPC .............. *G01R 27/18* (2013.01); *G01R 27/025* (2013.01); *G01R 31/025* (2013.01)

(58) Field of Classification Search
  CPC .. G01R 31/021; G01R 31/024; G01R 31/025; G01R 31/026; G01R 31/12; G01R 31/1263; G01R 31/1272; G01R 31/2812; G01R 31/31924; G01R 27/025; G01R 27/18; G01R 27/2617; G01N 27/205
  USPC ............ 324/750.01, 537, 500, 541, 544, 551, 324/557
  See application file for complete search history.

(56) References Cited

U.S. PATENT DOCUMENTS

| 4,528,497 A | 7/1985 | Arato |
| 4,638,242 A | 1/1987 | Matsuno |

(Continued)

FOREIGN PATENT DOCUMENTS

| DE | 101 06 200 C1 | 9/2002 |
| EP | 0 593 007 A | 4/1994 |

(Continued)

OTHER PUBLICATIONS

Search report issued in corresponding International application PCT/EP2010/05553, completed on Jul. 7, 2010 and mailed Jul. 13, 2010.

(Continued)

*Primary Examiner* — Hoai-An D Nguyen
(74) *Attorney, Agent, or Firm* — Griffin & Szipl, P.C.

(57) ABSTRACT

The invention relates to a method and a device for monitoring the insulation of an ungrounded DC and/or AC voltage network. The method includes the following steps: (a) generating a measurement DC voltage $U_{mess=}$ that is connected to a ground on one side for a $t_{var}$; predeterminable measuring time frame $t_{var}$; (b) generating and superposing at least one measurement AC voltage $U_{mess\sim}$ connected to a ground and having a measurement duration $t_{cons}$ with the measurement DC voltage $U_{mess=}$ for forming a total measurement voltage $U_{mess}$; (c) feeding the total measurement voltage $U_{mess}$ into the voltage network to be monitored; and (d) determining an insulating resistance $R_=$ from the measurement DC voltage $U_{mess=}$ and an insulating impedance Z from the measurement AC voltage $U_{mess\sim}$. The devise is configured to carry out the above method. The method and the device are suited in particular for monitoring the insulation in electric and hybrid vehicles.

39 Claims, 5 Drawing Sheets

(56) References Cited

U.S. PATENT DOCUMENTS

| | | | |
|---|---|---|---|
| 5,321,363 A * | 6/1994 | Wakamatsu et al. | 324/523 |
| 5,450,328 A | 9/1995 | Janke et al. | |
| 2012/0086459 A1 * | 4/2012 | Kim | 324/522 |
| 2013/0221997 A1 * | 8/2013 | Garcia Alvarrez et al. | 324/709 |

FOREIGN PATENT DOCUMENTS

| | | |
|---|---|---|
| EP | 0 654 673 | 5/1995 |
| EP | 1 586 910 A | 10/2005 |
| JP | 11-304855 | 11/1999 |

OTHER PUBLICATIONS

International Electrotechnical Commission, Electrical Safety in Low Voltage Distribution Systems Up to 1,000 V a.c. and 1,500 V d.c.—Equipment for testing, measuring or monitoring of protective measures—Part 8: Insulation Monitoring Devices for IT systems, (Dec. 11, 2014), available at http://webstore.iec.ch/webstore/webstore.nsf/ArtNum_PK/50424?OpenDocument (abstract).

Bender GmbH & Co., Isometer IRDH275: Insulation monitoring device for unearthed AC, AC/DC and DC systems (IT systems) (Dec. 2014).

Bender GmbH & Co., IT Systems: the basis for reliable power supply, Technical Information No. 1 (Jan. 2014). 4. Bender GmbH & Co., IR155 03/04 Series: Ground fault detector for ungrounded AC/DC drive systems for electric vehicles, Technical Bulletin (Jul. 2013).

Bender GmbH & Co., IR155 03/04 Series: Ground fault detector for ungrounded AC/DC drive systems for electric vehicles, Technical Bulletin (Jul. 2013).

Bender GmbH & Co., Isometer IR 155-3203/IR155-3204: Insulation monitoring device (IMD) for unearthed DC drive systems (IT systems) in electric vehicles (May 2013).

Holger Potdevin, Insulation Monitoring in High Votlage Systems for Hybrid and Electric Vehicles, ATZ Elektronik vol. 6, pp. 28-31 (Nov. 2009), available at http://www.atzelektronik-worldwide.com/index.php?issueId=686&smart42SID=1epaus3gra5cm7I4pj8s606n80.

Holger Potdevin & Geral Scheffels, New Measurement Method Increases Safety, Whitepaper (Feb. 12, 2009).

Bender GmbH & Co.. Electrical Safety for Emobility (Sep. 2014).

\* cited by examiner ing of the converter, low frequencies are to be anticipated for the interference and fluctuations in voltage and current values, such that conventional DC-based methods of measurement to determine the insulation measured value are almost impossible to deploy in practice. Therefore such methods can only be deployed to determine insulation faults under operating conditions with a stable voltage, for example, in the
METHOD AND DEVICE FOR MONITORING THE INSULATION OF UNGROUNDED DC AND AC VOLTAGE NETWORKS This is a Continuation-in-Part Application in the United States of International Patent Application No. PCT/EP2010/055553, filed Apr. 26, 2010, which claims priority from European Patent Application No. 09161290.3, filed May 27, 2009. The entire disclosures of the above patent applications are hereby incorporated by reference.

FIELD OF THE INVENTION

The invention relates to a method for monitoring the insulation of an unearthed DC and/or AC network.

Furthermore, the invention relates to a device for the execution of the above-cited method.

BACKGROUND OF THE INVENTION

Methods for monitoring the insulation of DC and AC networks by applying a DC voltage relative to ground over a measurement period, tracking its behaviour over time as a leakage capacitance decays, and measuring an insulation resistance relative to ground from its behaviour, are well known.

However, as a result of the network leakage capacitances present and also various disturbances in the network to be monitored, these DC-based methods of measurement are often inaccurate or cannot be used. Consequently, in the accepted manner of known art, the recommendation is to execute a plurality of measurement intervals one after another and to average arithmetically the measured values thereby achieved, or to correlate them in another manner in order to derive better information concerning the insulation resistance relative to ground. In this regard reference is made to EP 0 654 673 B1, EP 1 586 910 B1 and DE 101 06 200 C1.

What is disadvantageous in the above-cited methods, however, is the fact that a plurality of measurement periods must be considered in order to derive a valid measured value. In one variant, a stable measurement pulse must be generated with extrapolation from intermediate values to the final value, and a comparison of the extrapolated final value with the measured final values must also be undertaken, this procedure being complicated and susceptible to disturbances. As soon as the comparison fails to provide an equality or a permissible deviation, the measurements must be repeated until valid measured values are present. In particular, in cases of highly fluctuating network loads or low frequency elements of interference in the network, high inductive or capacitive loads such as networks in which voltage regulation takes place, either the measurement time is lengthened as a function of the frequency and amplitude of the interference, or no valid measured values can be determined over acceptable measurement times.

In recent times the number of motor applications controlled by a converter, in which single-phase or three-phase AC synchronous or asynchronous machines find application, has been increasing strongly. In these networks, as a result of the low switching frequency and also the calibration and control processes of the converter, low frequencies are to be anticipated for the interference and fluctuations in voltage and current values, such that conventional DC-based methods of measurement to determine the insulation measured value are almost impossible to deploy in practice. Therefore such methods can only be deployed to determine insulation faults under operating conditions with a stable voltage, for example, in the stationary state or in defined motor states, but under no circumstances in cases of dynamic load regulation.

On the other hand, methods for measuring the impedance between phase and earth are also of known prior art. In these methods, a sinusoidal measurement voltage is applied between an insulated system and ground, so that the frequency of the measurement signal is in a fixed ratio to the frequency of the network voltage.

Thus, for example, a microcontroller-implemented frequency-selective measurement method emerges from U.S. Pat. No. 5,450,328 in which a network leakage impedance Z is calculated from a measurement frequency and phase matched to the network frequency; from which ohmic and capacitive components can be derived. In this context, two measurement voltage sources generate two measurement voltages displaced by 180° into the two phases of an AC voltage network, which are coupled into the network, so that a frequency-selective voltmeter decouples measurement voltages and currents from the network. However, this method has the disadvantage that it renders necessary an increased level of measurement effort as well as complex signal recording, so that, in the case of high leakage capacities, only a very inaccurate estimation of the leakage resistance can be achieved.

What is disadvantageous in all of the above-cited methods is the fact that, particularly in networks with high dynamic loads such as converter circuits for the operation of motors deployed in hybrid electric vehicles, only inaccurate measurement results can be determined. Essentially, no measurements for monitoring the insulation resistance relative to ground can be undertaken.

SUMMARY OF THE INVENTION

Thus it is the object of this invention to propose a method and a device for monitoring the insulation of unearthed DC and AC networks so that the insulation resistance can be permanently monitored under operational conditions in a significantly more accurate manner, making a reliable recording of insulation defects possible. This is particularly important in electric vehicles, so that interruptions or disturbances to the network, which can cause hazard to the user as a result of a defective function such as the occurrence of a hazardous contact voltage, the loss of energy, fire or explosion caused by the formation of sparks, or corrosion as a result of stray currents, can be efficiently avoided.

In accordance with a first embodiment of the method, a method for monitoring the insulation of an unearthed DC and/or AC voltage network, comprising the steps: generation of a DC measurement voltage $U_{mess=}$ connected on one side to ground (16) for a predeterminable measurement period $t_{var}$; generation and superposition of at least one AC measurement voltage $U_{mess\sim}$ connected to ground (16) with a periodic time $t_{cons}$ onto the DC measurement voltage $U_{mess=}$ for the purpose of forming a total measurement voltage $U_{mess}$; introduction of the total measurement voltage $U_{mess}$ into the voltage network to be monitored; and determination of an insulation resistance $R_=$ on the basis of the DC measurement voltage $U_{mess=}$ and an insulation impedance $Z_\sim$ on the basis of the AC measurement voltage $U_{mess\sim}$.

In accordance with a second embodiment of the method, the first method is further modified so that for the purpose of determining the insulation resistance $R_=$ and the insulation impedance $Z_\sim$ a measurement is undertaken of a total measured current $I_{mess}$ generated by the total measurement voltage $U_{mess}$; wherein the total measured current $I_{mess}$ is divided into a DC measured current $I_{mess=}$ and an AC measured current $I_{mess\sim}$; and in that a determination of an insulation resistance $R_=$ is undertaken on the basis of the DC measured current $I_{mess=}$ and that of the insulation impedance $Z_\sim$ on the basis of the AC measured current $I_{mess\sim}$. In accordance with a third embodiment of the method, the first embodiment and the second embodiment are further modified so that an insulation resistance $R_\sim$ and a leakage capacitance $C_\sim$ are determined from the insulation impedance $Z_\sim$.

In accordance with a fourth embodiment of the method, the third embodiment is further modified so that in the case of a voltage network-specific small leakage capacitance $C_\sim$ the insulation resistance $R_\sim$ is outputted as an insulation resistance of the voltage network, and in the case of a large leakage capacitance $C_\sim$ the insulation resistance $R_=$ is outputted as an insulation resistance of the voltage network. In accordance with a fifth embodiment of the method, the third embodiment and the fourth embodiment are further modified so that in the case of a difference between the insulation resistances $R_\sim$ and $R_=$ that exceeds tolerances the method is repeated with variation of the DC voltage measurement period $t_{var}$ and/or the periodic time $t_{cons}$, until $R_\sim$ and $R_=$ have come closer together, at least within a predeterminable tolerance range.

In accordance with a sixth embodiment of the method, the second embodiment is further modified so that the measurement of the total current $I_{mess}$, or the measurement current components $I_{mess\sim}/I_{mess=}$ comprises a digitalisation of the measured values. In accordance with a seventh embodiment of the method, the second embodiment is further modified so that the division of the total measured current $I_{mess}$ into the DC measured current $I_{mess=}$ comprises at least one low-pass filtering of the total measured current $I_{mess}$ by means of a low-pass filter (05, 06). In accordance with an eighth embodiment of the method, the second embodiment is further modified so that the division of the total measured current $I_{mess}$ into the AC measured current $I_{mess\sim}$ comprises a band-pass filtering of the total measured current $I_{mess}$ by means of a band-pass filter (07).

In accordance with a ninth embodiment of the method, the seventh embodiment and the eighth embodiment are further modified so that the bandwidth and the central frequency of the band-pass filter (07) and/or the cut-off frequency of the low-pass filter (05, 06) can be adjusted electronically. In accordance with a tenth embodiment of the method, the first embodiment, the second embodiment, the third embodiment, the fourth embodiment, the fifth embodiment, the sixth embodiment, the seventh embodiment, the eighth embodiment, and the ninth embodiment are further modified so that the method for monitoring the insulation is executed cyclically, in particular continuously, with adjustable time intervals between the measurements. In accordance with an eleventh embodiment of the method, the tenth embodiment is further modified so that the determination of the insulation resistance R= comprises a statistical evaluation of the measured values $R_\sim$, $I_{mess=}$ and/or $U_{mess=}$ over a plurality of measurement cycles executed one after another with measurement periods $t_{var}$, in particular a continuous formation of an average value.

In accordance with a twelfth embodiment of the method, the tenth embodiment and the eleventh embodiment are further modified so that the measurement period $t_{var}$ is variably adjustable for each measurement cycle, in order to combat the leakage capacitance and disturbances of the voltage network. In accordance with a thirteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment and the twelfth embodiment are further modified so that a measurement period $t_{var}$ is determined from a derived insulation impedance $Z_\sim$, in accordance with the equation $t_{var}=n*R_i*C_\sim$, where $R_i$ is the internal resistance of the insulation measurement unit, and $n \geq 3$. In accordance with a fourteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, and the thirteenth embodiment are further modified so that the measurement period $t_{var}$ is at least one second.

In accordance with a fifteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment and the fourteenth embodiment are further modified so that the measurement period $t_{var}$ is between one and five seconds in length. In accordance with a sixteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment, the fourteenth embodiment, and the fifteenth embodiment are further modified so that the measurement period $t_{var}$ is a whole number multiple of the periodic time $t_{cons}$. In accordance with a seventeenth embodiment of the method, the sixteenth embodiment is further modified so that the periodic time $t_{cons}$ is approximately $t_{var}/10$.

In accordance with an eighteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment, the fourteenth embodiment, the fifteenth embodiment, the sixteenth embodiment and the seventeenth embodiment are further modified so that the periodic time $t_{cons}$ is approximately 0.1 seconds. In accordance with a nineteenth embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment, the fourteenth embodiment, the fifteenth embodiment, the sixteenth embodiment, the seventeenth embodiment and the eighteenth embodiment are further modified so that the periodic time $t_{cons}<2\pi C_\sim R_\alpha$, wherein $R_\alpha$ is the response value of an insulation measurement unit (18), which measures the insulation values.

In accordance with a twentieth embodiment of the method, the sixth embodiment is further modified so that the determination of the insulation impedance $Z_\sim$ comprises a discrete Fourier transformation (DFT/FFT), wherein at least the determination of the insulation impedance, the leakage capacitance $C_\sim$ and the insulation resistance $R_\sim$ is undertaken in the frequency domain. In accordance with a twenty-first embodiment of the method, the second embodiment is further modified so that the leakage capacitance $C_\sim$ is determined by means of the measured insulation impedance $Z_\sim$ and the insulation resistance $R_=$ in accordance with $$C_\sim = \frac{1}{\omega}\sqrt{\frac{1}{Z_\sim^2} - \frac{1}{R_=^2}},$$

where ω is the angular frequency of the alternating circuit.

In accordance with a twenty-second embodiment of the method, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment, the fourteenth embodiment, the fifteenth embodiment, the sixteenth embodiment, the seventeenth embodiment, the eighteenth embodiment, the nineteenth embodiment, the twentieth embodiment and the twenty-first embodiment are further modified so that, in a voltage network with a dynamically alterable voltage, the method is deployed for monitoring the insulation in a converter circuit for the dynamic operation of a single-phase or three-phase AC motor (15), wherein a DC circuit is coupled via a converter (12) with a motor circuit. In a twenty-third embodiment of the method, the twenty-second embodiment is further modified so that the method is applied in a vehicle with an electric motor drive, in particular in a hybrid vehicle, for the purpose of insulation monitoring. In accordance with a twenty-fourth embodiment of the method, the twenty-third embodiment is further modified so that the electric motor can also operate as a generator, and a transfer of energy can take place from the motor side to the DC side, wherein the method can monitor the insulation when the motor is operating in either motor mode or generator mode.

In accordance with a twenty-fifth embodiment of the method, the twenty-second embodiment, the twenty-third embodiment and the twenty-fourth embodiment are further modified so that the insulation resistance or the leakage impedance of the DC circuit (08, 09) and/or of the single-phase or three-phase AC motor circuit (13, 14) is respectively monitored. In accordance with a twenty-sixth embodiment of the method, the twenty-second embodiment, the twenty-third embodiment, the twenty-fourth embodiment and the twenty-fifth embodiment are further modified so that in the case of simultaneous monitoring of the insulation resistances/impedance (08, 09, 13, 14) in the DC and motor circuits the periodic time $t_{cons}$ of the respective AC measurement voltages $U_{mess\sim}$ is selected such that the measurement signals do not interfere with one another.

In accordance with a twenty-seventh embodiment of the method, the twenty-second embodiment, the twenty-third embodiment, the twenty-fourth embodiment, the twenty-fifth embodiment and the twenty-sixth embodiment are further modified so that the total measurement voltage $U_{mess}$ is coupled via two coupling resistances (02) into the two DC paths between DC source (01) and converter (12). In accordance with a twenty-eighth embodiment of the method, the twenty-second embodiment, the twenty-third embodiment, the twenty-fourth embodiment, the twenty-fifth embodiment and the twenty-sixth are further modified so that the total measurement voltage $U_{mess}$ is coupled via at least two coupling resistances (02) into at least two phases of a three-phase motor circuit. In accordance with a twenty-ninth embodiment of the method, the twenty-second embodiment, the twenty-third embodiment, the twenty-fourth embodiment and the twenty-fifth embodiment are further modified so that the total measurement voltage $U_{mess}$ is coupled in via at least two coupling resistances (02), wherein a first coupling resistance (02) is coupled into the DC circuit, and a second coupling resistance (02) is coupled into the motor circuit, wherein at least the insulation resistance of both circuits can be determined, if no energy transfer is taking place through the converter (12).

In accordance with a thirtieth embodiment of the present invention, a device for the execution of a method in accordance with one of the above-cited embodiments of the method, comprising an impulse measurement voltage source (04), connected on one side with ground (16), for the purpose of generating a total measurement voltage $U_{mess}$, at least one coupling network (02, 03), comprising at least one coupling resistance (02) and one measuring resistance (03) for the purpose of coupling the total measurement voltage $U_{mess}$ into the voltage network, and an insulation measurement unit (18) for the purpose of determining the leakage impedance and the insulation resistance, characterised in that the impulse measurement voltage source (04) is designed to generate a total measurement voltage $U_{mess}$, which ensues from a superposition of a DC measurement voltage $U_{mess=}$ with a predeterminable measurement period $t_{var}$, and at least one AC measurement voltage $U_{mess\sim}$ with a periodic time $t_{cons}$, and in that the insulation measurement unit (18) is designed for the purpose of determining an insulation resistance $R_=$ on the basis of the DC measurement voltage $U_{mess=}$ and an insulation impedance $Z_\sim$ on the basis of the AC measurement voltage $U_{mess\sim}$.

In accordance with a thirty-first embodiment of the present invention, the thirtieth embodiment is further modified so that the insulation measurement unit (18) comprises filter elements, which are designed to divide a total current $I_{mess}$ measured on the measuring resistance (03) into a DC measured current $I_{mess=}$ and an AC measured current $I_{mess\sim}$, wherein the determination of the insulation resistance $R_=$ takes place on the basis of the DC measured current $I_{mess=}$ and that of the insulation impedance $Z_\sim$ on the basis of the AC measured current $I_{mess\sim}$. In accordance with a thirty-second embodiment of the present invention, the thirty-first embodiment is further modified so that the filter elements comprise at least one low-pass filter (06) for the derivation of the insulation resistance $R_=$ and one band-pass filter (07) for the derivation of the insulation impedance $Z_\sim$.

In accordance with a thirty-third embodiment of the present invention, the thirtieth embodiment and the thirty-first embodiment of the present invention are further modified so that the filter elements comprise one upstream low-pass filter (05) for the purpose of filtering out interference signals. In accordance with a thirty-fourth embodiment of the present invention, the thirtieth embodiment, the thirty-first embodiment, the thirty-second embodiment and the thirty-third embodiment are further modified so that at least parts of the filter elements (05, 06, 07) are designed as filter elements that can be electronically adjustable under operational conditions, so that frequency parameters such as cut-off, central and bandwidth frequencies can be adjusted. In accordance with a thirty-fifth embodiment of the present invention, the thirtieth embodiment, the thirty-first embodiment, the thirty-second embodiment, the thirty-third embodiment and the thirty-fourth embodiment are further modified so that the insulation measurement unit (18) comprises at least one A/D-converter, in order to convert the current and/or voltage values measured on the measuring resistance (03) to digital forms.

In accordance with a thirty-sixth embodiment of the present invention, the thirty-fifth embodiment is further modified so that the insulation measurement unit (18) comprises at least one FFT/DFT processing unit, in order to transform at least the values measured for the derivation of the leakage impedance $Z_\sim$ into the frequency domain. In accordance with a thirty-seventh embodiment of the present invention, the thirtieth embodiment, the thirty-first embodiment, the thirty-second embodiment, the thirty-third embodiment, the thirty-fourth embodiment, the thirty-fifth embodiment and the thirty-sixth embodiment are further modified so that the insulation measurement unit (18) comprises a microcontroller, which is designed to undertake signal processing of the measurement voltage/current values, and to determine the derived insulation resistance $R_=$ and the derived insulation impedance $Z_\sim$, or the insulation resistance $R_\sim$ and the leakage capacitance $C_\sim$.

In accordance with the thirty-eighth embodiment of the present invention, the thirtieth embodiment, the thirty-first embodiment, the thirty-second embodiment, the thirty-third embodiment, the thirty-fourth embodiment, the thirty-fifth embodiment, the thirty-sixth embodiment and the thirty-seventh embodiment are further modified so that the insulation measurement unit (18) comprises an I/O-interface, wherein by means of an optical coupler (11) pulse-width modulated (PWM-modulated) data of the insulation measurement unit (18) can be outputted. In accordance with a thirty-ninth embodiment of the present invention, the thirtieth embodiment, the thirty-first embodiment, the thirty-second embodiment, the thirty-third embodiment, the thirty-fourth embodiment, the thirty-fifth embodiment, the thirty-sixth embodiment, the thirty-seventh embodiment and the thirty-eighth embodiment are further modified so that the insulation measurement unit (18) comprises an I/O-interface, wherein the I/O-interface can transfer digital data to a CAN or LIN interface.

Advantageous further developments are the subjects of those embodiments that refer back to the first and thirtieth embodiments of the present invention.

The inventive method proposes the generation of a total measurement voltage $U_{mess}$, which is composed of a DC component $U_{mess=}$ and an AC component $U_{mess\sim}$. After introduction of this total measurement voltage a total measurement current $I_{mess}$ can be measured on a measuring resistance; this in turn can be decomposed into the components generated by the DC measurement voltage $U_{mess=}$ and the AC measurement voltage $U_{mess\sim}$. By means of the measured values generated by the DC measurement voltage and the AC measurement voltage, can then be determined independently of one another an insulation resistance $R_=$ on the basis of the DC measurement voltage $U_{mess=}$, and an insulation impedance, which in general terms is composed of an insulation resistance $R_\sim$ and a leakage capacitance $C_\sim$.

Particularly in vehicle networks of hybrid vehicles with high levels of dynamic changes in load, it has been established from tests and measurements that the changes in voltage that occur as a result of the charging and discharging cycles of the energy store of the hybrid electric vehicle, translate into serious disturbances in a conventional insulation monitoring unit. In the measurement methods of known art, a measurement or a measurement cycle is suppressed if the changes in voltage exceed certain amplitudes and frequencies in the vicinity of the basic measurement frequencies. In many cases this leads to the fact that the insulation resistance can only be determined during approximately 20% of the total operating time of the voltage network.

By virtue of the division of the insulation monitoring measurement into a DC measurement component and at least one AC measurement component that can be executed independently, a rapid measurement of the insulation characteristic of the voltage network can be undertaken by means of the AC component that is independent of dynamic changes in load, so that the probability of an active measurement of the insulation resistance under driving conditions can be significantly increased. Furthermore, with this method the leakage impedances that are relevant to personal protection can also be monitored.

In an advantageous further development of this method the insulation resistance $R_=$ and the insulation impedance $Z_\sim$ are determined by means of a measurement of the total measured current $I_{mess}$ generated by the total measurement voltage $U_{mess}$. Here the total measured current $I_{mess}$ is divided into a DC measured current $I_{mess=}$ and an AC measured current $I_{mess\sim}$; the insulation resistance is determined on the basis of the DC component $I_{mess=}$ and the insulation impedance $Z_\sim$ is determined on the basis of the AC component $I_{mess\sim}$.

In other words the total measured current $I_{mess}$ generated by the total network voltage $U_{mess}$ is divided by means of any suitable method into a DC component $I_{mess=}$ and an AC component $I_{mess\sim}$. This division can be undertaken in any suitable manner; frequency filters are particularly advantageous for the division, wherein in a first step, a low-pass filter filters out unwanted high frequency components from the measured voltage or current signal; in a further step the DC current $I_{mess=}$ is then filtered out with the aid of a low-pass filter, and the AC current $I_{mess\sim}$ by means of a band-pass filter.

As a result of the filtering process two current components are provided, which relate to the action of the corresponding measurement voltage components, and with their help the insulation resistances $R_=$ or $R_\sim$ can be determined independently of one another, and in the case of the AC measurement voltage, a leakage capacitance $C_\sim$ can also be determined.

Thus it is advantageously also possible and desirable to determine from the insulation impedance $Z_\sim$ both an insulation resistance $R_\sim$ and also a leakage capacitance $C_\sim$.

In principle, the insulation resistance values $R_=$ and $R_\sim$ derived from the DC measurement voltage $U_{mess=}$ and the AC measurement voltage $U_{mess\sim}$, respectively, should be identical. However, differences can arise when determining the insulation resistance, in particular in networks with high levels of interference and high leakage capacitances. In the case of a voltage network with a small leakage capacitance $C_\sim$, it is advantageously possible to output the insulation resistance $R_\sim$ as the insulation resistance of the voltage network, and in the case of a large leakage capacitance $C_\sim$ to output the insulation resistance $R_=$ as the insulation resistance. Thus it is prescribed that in the case of a small leakage capacitance $C_\sim$ the insulation resistance $R_\sim$ derived from the AC measurement voltage can be determined more accurately than the insulation resistance $R_=$ derived from the DC measurement voltage. In the case of high leakage capacitances $C_\sim$, it is accepted that the insulation resistance can be determined more accurately with the aid of the DC measurement voltage components. Here it should, be emphasised that the assessment of a "low" or a "high" leakage capacitance of a network is a specific factor based on experience. In assessing the leakage capacitance, typical influences on capacitance, such as cable lengths, voltage levels, conductor cross-sections, the insulation materials used, the running of cables and other influence factors related to the topology of the network, are taken into account.

By virtue of the ability of the inventive method to determine insulation resistances in different ways, it can be definitely sensible to compare the insulation resistances determined in different ways with one another, in order to be able to draw conclusions concerning the accuracy of the method.

Thus in one embodiment, in the event of a difference between the insulation resistances $R_\sim$ and $R_=$ that exceeds tolerances the method should be repeated with alterations of the DC measurement period $t_{var}$ and/or the periodic time $t_{cons}$ until the insulation resistance values $R_=$ and $R_\sim$ have come closer together, at least within a predeterminable range of tolerance. Thus different measured results for the insulation resistances can be an indicator of inaccurate measurements, in the event of which either the DC measurement period or the frequency of the AC measurement voltage should be altered in order to obtain more accurate conclusions regarding the value of the insulation resistance. By the definition of a tolerance interval in which the two insulation resistances approximate to one another, it can be ensured that a certain prescribed accuracy for the insulation resistance determination can be achieved. In principle, the insulation resistances can be determined as analogue values. However, it is conceivable and extremely advantageous that the measurement of the total current, or the measurement current components comprises a digitalisation of the measured values. By means of digitalisation with the aid of formulae from signal theory, further signal processing can be executed more easily, so that software-based variations of the measurement method can be undertaken in a simple and uncomplicated manner.

As has already been indicated above, in accordance with one embodiment the total measured current $I_{mess}$ is to be divided into the two measured current components $I_{mess=}$ and $I_{mess\sim}$. For the extraction of the DC measured current, it is advantageous to derive this by means of low-pass filtering of the total measured current $I_{mess}$. Furthermore, the AC measured current $I_{mess\sim}$ can likewise be extracted from the total measured current $I_{mess}$ by means of band-pass filtering. Here it can be particularly advantageous if the bandwidth and the central frequency of the band-pass filter deployed, and/or the cut-off frequency of the low-pass filter, can be adjusted electronically. In particular, in the case of digital processing of the measured current and/or the measurement voltages the ability to adjust the filter coefficients deployed can thus be provided easily with the aid of software.

In principle, the insulation resistance can be determined as often as required at different points in time. However, it is particularly advantageous if the method for monitoring the insulation is executed cyclically, i.e. repetitively and continuously with adjustable time intervals between the measurements. Cyclic measurement ensures that up to date measuring results concerning the insulation status of the network are always available under operational conditions. Continuous insulation monitoring means here that new measurements of the insulation status are undertaken at regular time intervals.

It is already of known prior art that when deriving the insulation resistance $R_=$ fluctuations caused by dynamic changes in load or low-frequency components represent certain sources of error. Thus in one advantageous example of embodiment, the derivation of the insulation resistance $R_=$ and/or $R_\sim$ can be undertaken by means of a statistical evaluation of the measured values from a plurality of measurement cycles executed one after another with measurement periods $t_{var}$, in particular with the continuous formation of an average value. Thus it is possible with measurements of the insulation status undertaken repeatedly to undertake a more accurate derivation of the insulation resistance by means of, for example, a continuous formation of an average value, or an approximation of the last measured insulation resistances, in order to achieve an accurate derivation of the insulation resistance and to suppress sources of error conditioned by the system.

Furthermore, it is definitely conceivable for the measurement period to be variably adjustable for each measurement cycle, so as to combat the leakage capacitances and disturbances of the voltage network. Thus, in the event of high levels of dynamic changes in load the measurement period $t_{var}$ can be lengthened, in order to undertake a new measurement at a time in which the changes in load are small, and in this manner achieve a high measurement accuracy.

For this purpose it is particularly advantageous if the measurement period $t_{var}$ is var variably adjustable for each measurement cycle, so as to determine the leakage capacitance exactly and combat disturbances in the voltage network.

In principle, the measurement period for the measurement of the DC component $R_=$ can be selected to be of any value. However, the accuracy of the DC measured results fundamentally depends on the level of the leakage capacitance $C_\sim$ which causes fluctuating behaviour of the DC measurement. It is therefore advantageous if the measurement period $t_{var}$ is determined in accordance with a derived insulation impedance $Z_\sim$, which enables a conclusion to be drawn concerning the leakage capacitance $C_\sim$, in accordance with the equation $t_{var}=n*R_i*C_\sim$, where $R_i$ is the internal resistance of the insulation measurement unit, and $n \geq 3$.

It is particularly advantageous if the DC measurement period $t_{var}$ is determined as $5*R_i*C_\sim$, so as to ensure a high accuracy for the DC measured results.

Here, in typical applications, the measurement period $t_{var}$ can be at least one second, or can be selected as a time of between one and five seconds.

Furthermore it is advantageous if the periodic time $t_{cons}$ is a whole number fraction of the measurement period $t_{var}$, so that a whole number of cycles of the AC component $U_\sim$ can be accommodated in one measurement period $t_{var}$ of the DC measurement voltage $U_=$.

In particular, it is advantageous if the periodic time $t_{cons}$ is approximately $t_{var}/10$. Furthermore, it is advantageous if the periodic time $t_{cons}$ is approximately 0.1 seconds.

In accordance with one example of embodiment, a mathematical relationship is formed between the periodic time $t_{cons}$, the size of the leakage capacitance $C_\sim$ and the response value $R_\alpha$ of the insulation measurement unit, i.e. the lowermost measurement threshold of the measurement unit, above which an insulation defect message can be outputted, together with which the inequality $t_{cons} < 2\pi C_\sim R_\alpha$ is to be maintained. Thus a frequency of the AC measurement voltage is prescribed, which ensures that a high level of accuracy can continue to be achieved for the AC measured values of the insulation capacitance and the insulation resistance.

In principle, the signal processing for the derivation of the leakage resistance and the leakage capacitance can be designed in any manner. In accordance with a particular example of embodiment cited above the signal processing is undertaken digitally, so that it is hereby fundamentally advantageous to execute the insulation impedance $Z_\sim$ by means of a discrete Fourier transformation, designed as DFT/FFT, wherein at least the insulation impedance $Z_\sim$, the leakage capacitance $C_\sim$ and the insulation resistance $R_\sim$ can be determined in the frequency range. By means of a derivation of the insulation behaviour on the basis of the AC components a simple evaluation with adjustable filter properties and any required level of accuracy can be achieved.

Fundamentally, the inventive method delivers two values $R_=$ and $R_\sim$ for the insulation resistance. On the basis of the AC measurement voltage a total impedance $Z_\sim$ can be determined, which in general terms ensues from the parallel arrangement of an insulation resistance $R_\sim$ and a leakage capacitance $C_\sim$. It is particularly in those cases in which the frequency-based insulation resistance $R_\sim$ can only be determined inaccurately that it is definitely advantageous and conceivable for the leakage capacitance $C_\sim$ to be calculated from the total impedance $Z_\sim$ and the insulation resistance $R_=$, which in such cases can usually be determined more accurately. Thus it is definitely advantageous to determine the leakage capacitance $C_\sim$ in accordance with the formula for a parallel circuit whilst taking into account the DC insulation value $R_=$, with the equation:

$$C_\sim = \frac{1}{\omega}\sqrt{\frac{1}{Z_\sim^2} - \frac{1}{R_=^2}}$$

Thus the DC measured insulation value, which in many cases can be determined more accurately, serves to provide a more accurate determination of the leakage capacitance $C_\sim$.

In principle, the inventive method can be called upon to determine the insulation of any DC and/or single-phase or three-phase AC current networks. The method is particularly suitable for use in a voltage network with a dynamically variable voltage so that insulation monitoring is deployed in a converter circuit used for the dynamic operation of a single-phase or three-phase AC motor, wherein a DC circuit is coupled with a motor circuit via a converter. As a result of the dynamic developments in power semiconductor technology, it is possible to generate a single-phase or three-phase AC voltage from a DC voltage at high power levels and at any frequency. Thus applications are growing in number in which three-phase AC synchronous or asynchronous motors are operated by means of a converter and a DC circuit that supplies the power, so as to generate different rotational speeds and levels of power output. A motor circuit of this kind is divided by the converter into two parts, a DC circuit and a motor circuit. The method is particularly well suited to cases where the motor controller exercises dynamic changes in load, in which both the insulation characteristics of the DC circuit and also the behaviour of the motor circuit can be measured independently of one another, or also combined with one another.

In particular, the method is suitable for insulation monitoring in a particular example of embodiment when applied in a vehicle with an electric motor drive such as a hybrid vehicle. Hybrid vehicles are distinguished by the fact that they have both a conventional combustion engine and an electric motor, where the combustion engine under no-load conditions feeds a battery, and under load conditions, the electric drive is connected or is fully responsible for movement of the vehicle. High dynamic loads occur when the electric drive is connected or fully responsible for the movement of the vehicle, and monitoring of the insulation resistance relative to ground becomes very important so as to prevent malfunctions, short-circuits or fires in the vehicle. In this context, the electric motor often serves as a generator, which, when descending hills, generates electrical power that is stored in the vehicle batteries. When operating in generator mode it is also therefore advantageous if the insulation monitoring method undertakes the monitoring of insulation conditions as energy is transferred from the motor/generator circuit to the DC circuit.

As already indicated above the method is excellently suited to the monitoring of the insulation resistance and leakage impedance not only in a DC circuit but also in a motor circuit. In particular, the method is suitable for use in determining the insulation resistance and leakage impedance of the DC circuit and/or the single-phase or three-phase AC motor circuit, where combined monitoring of both circuits appears to be particularly advantageous. In the case of simultaneous monitoring of the insulation resistances/impedance of the DC and motor circuit, it is particularly advantageous to select the periodic time $t_{cons}$ of the respective AC measurement voltages $U_{mess\sim}$ such that the measurement signals do not interfere with one another in the frequency range. Measurement of the insulation resistances takes place with the converter disconnected so that the measurements of the insulation resistances in the DC and motor circuits cannot interfere with one another. However, it is conceivable and possible to execute a combined measurement of the DC and motor circuits with an active converter; in this case, however, it is particularly advantageous if the measurement frequencies $1/t_{cons}$ of both circuits are selected to be different so that the AC measurement voltages/measured currents do not superpose and interfere with one another. Alternatively, it is also conceivable to execute the measurements in each of the two circuits in a time-multiplexed manner at those times in which no measurement is being executed in the other circuit.

Furthermore it would be definitely conceivable to deploy two or a plurality of different measurement frequencies in just one of the circuits in order to determine a plurality of leakage impedances that can be separated out over the frequency range. From these leakage impedances it can be determined, independently of one another, the insulation characteristics of the voltage network.

It is sufficient to couple the total measurement voltage $U_{mess}$ into the voltage network across a single coupling resistance, since in a DC network all current-carrying conductors can be measured relative to ground by means of a low resistance DC source; in the AC network in the motor circuit all motor phases can likewise be monitored by virtue of the low resistance motor windings. In the context of a measurement of a DC network it is nevertheless sensible that the total measurement voltage $U_{mess}$ is coupled in via two coupling resistances into the two DC voltage paths between DC source and converter. Furthermore, it is definitely sensible if, in the case of a measurement of the motor voltage circuit the total measurement voltage, $U_{mess}$ is coupled in via at least two coupling resistances in at least two phases of a three-phase motor circuit. Finally, in a combined measurement of the DC circuit and the motor circuit it is definitely conceivable and sensible to couple in the total measurement voltage via at least two coupling resistances, wherein a first coupling resistance is coupled into the DC circuit and a second coupling resistance is coupled into the motor circuit, and wherein at least the insulation resistance of both circuits can be determined, if no energy transfer is taking place through the converter.

A further embodiment of the method comprises an automatic periodic self-test of the unit executing the insulation monitoring. For this purpose all insulation monitoring components, in particular the insulation monitoring device itself and also the components located therein, are tested at regular time intervals, such as every 5 minutes, for function and correct connection of the device to the network that is to be monitored, particularly testing that the lowest possible resistance connection to the ground of the network is checked.

Furthermore, the invention relates to a device for the execution of an above-cited method, wherein the device comprises an impulse measurement voltage source connected on one side to ground for the generation of a total measurement voltage $U_{mess}$, at least one coupling network, comprising at least one coupling resistance and one measuring resistance for the purpose of coupling the total measurement voltage $U_{mess}$ into the voltage network, and an insulation measurement unit to determine the leakage impedance.

In accordance with the invention, the device is characterised in that the impulse measurement voltage source is designed to generate a total measurement voltage $U_{mess}$, which ensues from a superposition of a DC measurement voltage $U_{mess=}$ with a predeterminable measurement period $t_{var}$, and at least one AC measurement voltage $U_{mess\sim}$ with a periodic time $t_{cons}$. Furthermore, the insulation measurement unit is designed to determine an insulation resistance $R_=$ on the basis of the DC measurement voltage $U_{mess=}$, and an insulation impedance $Z_\sim$ on the basis of the AC measurement voltage $U_{mess\sim}$.

Thus the inventive device relates to a device that is fundamentally of known prior art, which includes an impulse measurement voltage source for the generation of a total measurement voltage $U_{mess}$, a coupling network with a coupling resistance, with the aid of which the total measurement voltage $U_{mess}$ can be coupled into the voltage network to be measured, and a measuring resistance, on which an insulation measurement unit can measure a voltage drop, in order to determine from this a total measured current $I_{mess}$. The impulse measurement voltage source is to be designed such that it can generate a superposition of a DC measurement voltage $U_{mess=}$ and an AC measurement voltage $U_{mess\sim}$, wherein the insulation measurement unit determines an insulation resistance $R_=$ on the basis of the DC voltage component $U_{mess=}$, and an impedance value $Z_\sim$ on the basis of the AC voltage component $U_{mess\sim}$.

Here, it is obvious and advantageous if the insulation measurement unit for the purpose of dividing the two measurement components, which are based on the DC measurement voltage $U_{mess=}$ and the AC measurement voltage $U_{mess\sim}$, comprises filter elements that are designed to divide a total current $U_{mess}$ measured on the measuring resistance into a DC measured current and an AC measured current. The determination of the insulation resistance $R_=$ takes place on the basis of the DC measured current $I_{mess=}$ and that of the insulation impedance $Z_\sim$ on the basis of the AC measured current $I_{mess\sim}$. The filter elements accordingly serve the purpose of dividing the individual measurement voltages arising from the total measurement voltage $U_{mess}$ and the measured currents that result from these, so as to execute a DC measurement and an AC measurement of the insulation characteristics that are independent of one another.

It is advantageous if the filter elements comprise at least one low-pass filter for a derivation of the insulation resistance $R_=$ and one band-pass filter for the derivation of the insulation impedance $Z_\sim$. The low-pass filter serves the purpose of decoupling signal components located below the measurement frequency, in order to draw upon these as the values related to the DC measurement voltage $U_{mess=}$ for the measurement of an insulation resistance $R_=$. The band-pass filter serves the purpose of filtering out those frequency components from the measured values that relate to the AC measurement voltage $U_{mess\sim}$.

Furthermore, it is definitely advantageous if the filter elements comprise an upstream low-pass filter for the purpose of filtering out interference signals. The upstream low-pass filter is designed to filter out as many as possible of the signal components that lie above the frequency of the AC measurement voltage $U_{mess\sim}$, in order to suppress high-frequency disturbing influences on the measurement.

Furthermore, in another embodiment, at least parts of the filter elements are designed to be electronically adjustable under operational conditions, so that frequency parameters such as cut-off, central and bandwidth frequencies can be adjusted. Thus, after a plurality of repeated measurement cycles in which only inaccurate or strongly varying values of the insulation resistances can be determined, the frequency of the impulse measurement voltage and also the filter frequencies can be altered such that the frequency-based measurement voltage values can be determined in another frequency range in which lower levels of interference are occurring.

It is particularly advantageous if the signal processing for the purpose of deriving the insulation status is undertaken digitally. For this purpose, it is advantageous if the insulation measurement unit comprises at least one A/D-converter, in order to convert the current and/or voltage values measured in the measuring resistance to digital forms. Furthermore, it is advantageously conceivable that the insulation measurement unit comprises at least one FFT/DFT-processing unit, in order to transform at least the measured values for the derivation of the leakage impedance $Z_\sim$ into the frequency domain. By the deployment of a frequency domain analysis simple filters can be used, and accurate impedance values can be derived in the frequency domain.

Finally, it is advantageous if the insulation measurement unit comprises a microcontroller that is designed to undertake signal processing of the measured voltage and current values, and to determine the derived insulation resistance $R_=$ and the derived insulation impedance $Z_\sim$, i.e. the insulation resistance $R_\sim$ and the leakage capacitance $C_\sim$. By means of a microcontroller, existing control and measurement software can be adapted or modified without much effort, so that the unit can be flexibly adapted to new deployment tasks.

Fundamentally, the insulation monitoring unit transmits data, in particular digital data, to an operations location on the insulation network, thus, for example, in the case of motor vehicle insulation monitoring, to the on-board electronics. This normally takes place by means of an I/O-interface. Finally it is advantageously conceivable that the insulation measurement unit comprises an I/O-interface, wherein by means of an optical coupler PWM-modulated data can be outputted from the insulation measurement unit, and/or the measurement unit can be programmed for the purpose of updating the operating software or adjusting operating parameters. The use of a galvanically isolated I/O-interface prevents the measurement electronics from being damaged in the event of disturbances, or supply network influences from affecting the insulation measurement unit.

In the context of data transfer, it is furthermore conceivable and advantageous if the insulation unit can transmit digital data to a standardised information transfer system or field bus system, in particular a CAN (Controller Area Network) bus or a LIN (Local Interface Network) bus, so that the input and output data of the insulation monitoring unit can be processed by a superordinate control and regulation unit.

BRIEF DESCRIPTION OF THE DRAWINGS

In what follows the figures represent advantageous examples of embodiment of the above-cited invention:
In the figures.

DETAILED DESCRIPTION OF THE INVENTION

Figure 1:
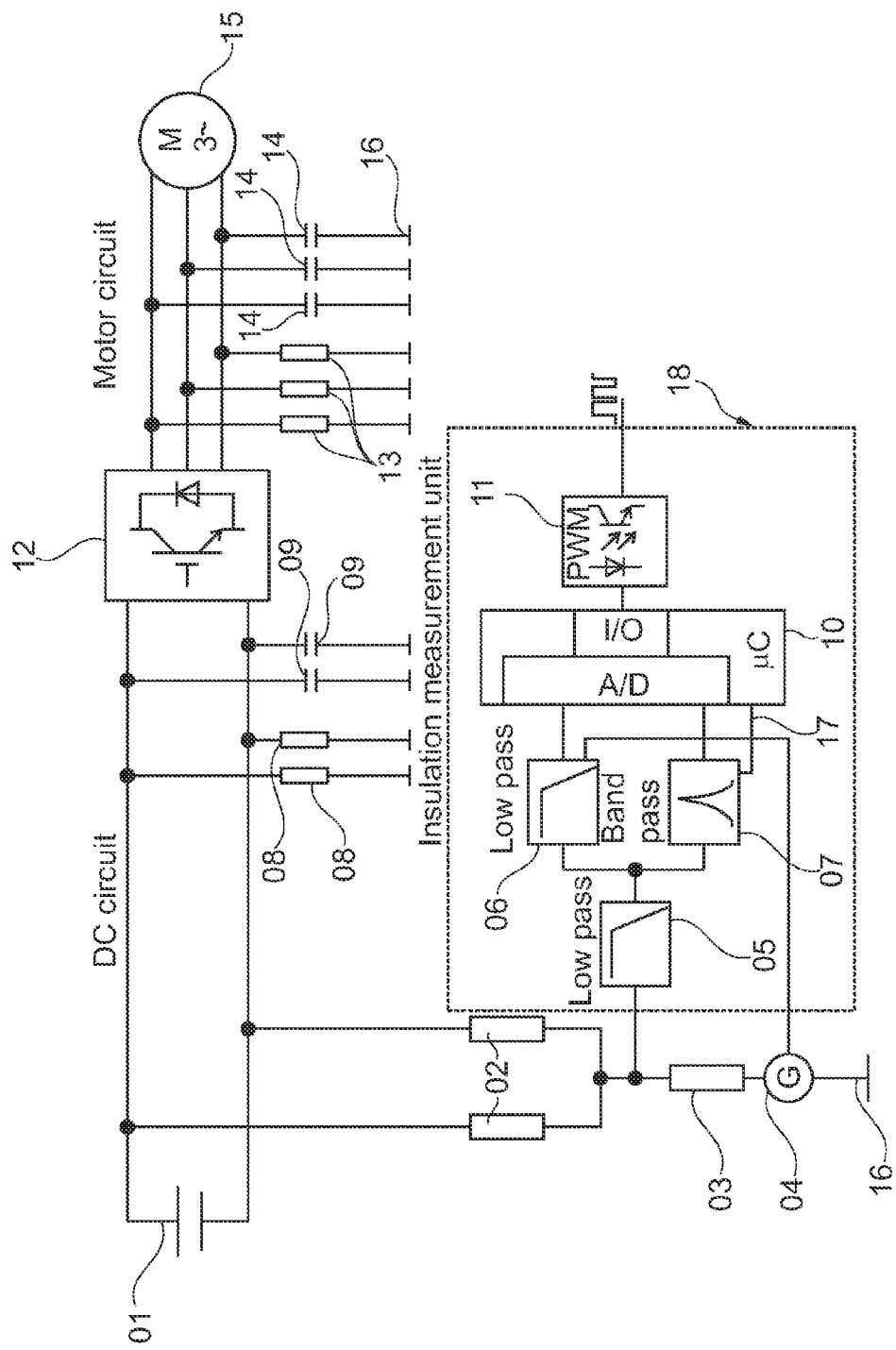
FIG. 1: shows a circuit diagram of an example of embodiment of an inventive insulation measurement device.

FIG. 1 represents a circuit diagram of an embodiment of an insulation measurement device. Here the circuitry comprises a DC circuit, in which a battery 01 feeds a converter 12, with the aid of which a three-phase AC voltage is converted from the DC voltage for the purpose of operating a three-phase AC motor 15 within a motor circuit. The DC circuit has an insulation resistance 08 and a leakage capacitance 09 relative to ground. The motor circuit with its three-phase supply lines to the motor 15 has three insulation resistances 13 and three leakage capacitances 14 relative to ground. Onto the two DC power buses, which connect the battery 01 with the frequency converter 12, are connected two coupling resistances 02 of a coupling network of an insulation measurement unit 18.

An impulse measurement voltage source 04 generates a total measurement voltage $U_{mess}$, which comprises a DC component $U_{mess=}$ and a component $U_{mess\sim}$ subject to frequency, wherein the first potential of the impulse measurement voltage source 04 is connected to ground 16, and the second potential is connected to a measuring resistance 03, the magnitude of which is accurately known. The total measurement voltage $U_{mess}$ generated by the impulse measurement voltage source 04 drops, via the measuring resistance 03, the two coupling resistances 02 and the DC buses of the DC circuit, via the leakage capacitance 09 and the insulation resistance 08, to ground. Here there is a voltage drop across the measuring resistance 03, from which the magnitude of the total measured current $I_{mess}$ can be determined. The insulation measurement unit 18 is connected to the measuring resistance 03, wherein the voltage drop is firstly filtered via a low-pass filter 05, in order to remove any disturbing high-frequency components from the measured signal. The voltage drop measured across the measuring resistance 03 is then on the one hand filtered via a low-pass filter 06, in order to filter out the DC voltage component $U_{mess=}$, and is also filtered via a band-pass filter in order to filter out the range of frequencies matched to the frequency of the AC measurement voltage $U_{mess\sim}$, in order to provide measured current values for the determination of the impedance. The measured current, thus divided up into $I_{mess=}$ and $I_{mess\sim}$, is fed to a micro-controller 10, which undertakes an analogue-to-digital conversion, and also executes a method to determine the insulation resistance $R_{=}$, and also the leakage impedance that is used to derive the insulation resistance $R_{\sim}$ and the leakage capacitance $C_{\sim}$. The insulation measurement results are transmitted from the microcontroller 10 via an optical coupler 11 to a monitoring unit (not shown).

In principle, therefore, a periodic pulsed measurement voltage is superposed onto a constant impulse measurement voltage and by means of separate filtering of the two measurement voltage components by means of the low-pass filter 06 and the band-pass filter 07 the insulation resistance is determined using two different methods. From the measurement signal of the initial low-pass filter 05 two final measured values are derived and compared with one another so that, in the event of agreement, an insulation value is calculated from the two voltage values. An agreement between the two insulation values $R_{\sim}$ and $R_{=}$ shows that the value for the DC measured value $R_{=}$ has stabilised. In the microcontroller 10 a discrete Fourier transformation is executed on the measured signal from the band-pass filter, in order to derive from this an impedance $Z_{\sim}$, from which the insulation resistance $R_{\sim}$ and the leakage capacitance $C_{\sim}$ of the AC measurement voltage can be calculated in turn. Dynamic alterations in voltage are filtered out by the steep flanks of the band-pass filter, enabling a continuous measurement of the insulation resistance in the case of small network leakage capacitances. In the case of larger network leakage capacitances, the insulation measured value is calculated from the final DC values from a measurement cycle. As a result of dynamic fluctuations of voltage differing final values ensue and the output of measured values can be suppressed.

In order to enable nevertheless a continuous output of measured values, a statistical method such as a continuous formation of an average value, which serves the purpose of suppressing the fluctuations in the measured values and ensuring a continuous output of measured values, is recommended.

For the purpose of avoiding measurement errors as a result of disturbances in the vicinity of the impulse measurement voltage frequency it is furthermore recommended that the central frequency of the band-pass filter, the cut-off frequency of the low-pass filter, and also the frequencies of the impulse measurement voltage are embodied such that they can be adjusted. For this purpose, the microcontroller 10, the low-pass filter 06, the band-pass filter 07, and also the measurement voltage source 04, are connected with one another, wherein the microcontroller 10 can adjust the frequency data of these components. If larger interference voltage amplitudes are located in the vicinity of the measurement frequency, the quality of the measurements can be increased by displacing the measurement frequency. The adjustment is undertaken automatically by the microcontroller 10.

Figure 2:
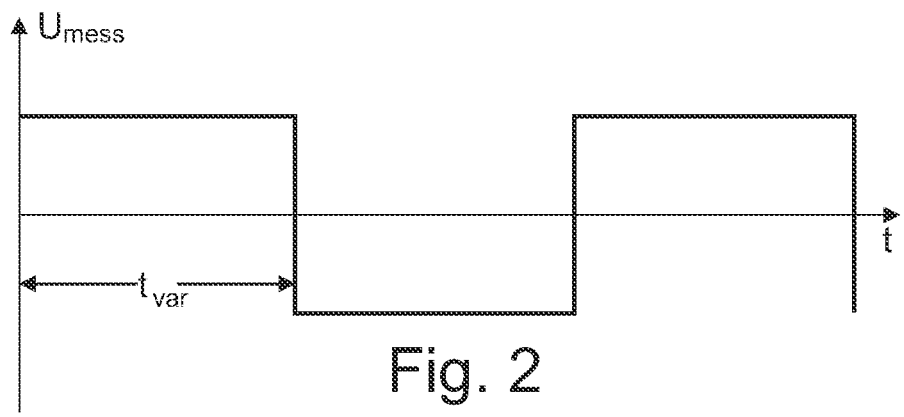
FIG. 2: shows the time-wise profile of a DC measurement voltage $U_{mess=}$ of an example of embodiment.

FIG. 2 shows the basic profile of the DC measurement voltage $U_{mess=}$. For this purpose the DC measurement voltage $U_{mess=}$ is held constant over a relatively long measurement period $t_{var}$, during which the DC measured current $I_{mess=}$ can be measured, in order to determine from this the insulation resistance $R_{=}$. In order to suppress errors conditioned by the system, after the end of the measurement time period $t_{var}$ an adjoining continuous measurement can be pursued with a reversed polarity, so that a DC measurement voltage $U_{mess=}$ of alternating polarity is always present. Thus the DC measurement voltage $U_{mess=}$ itself has an extremely low-frequency amplitude, whereby, however, a DC measurement is executed within a measurement period $t_{var}$.

Figure 3:
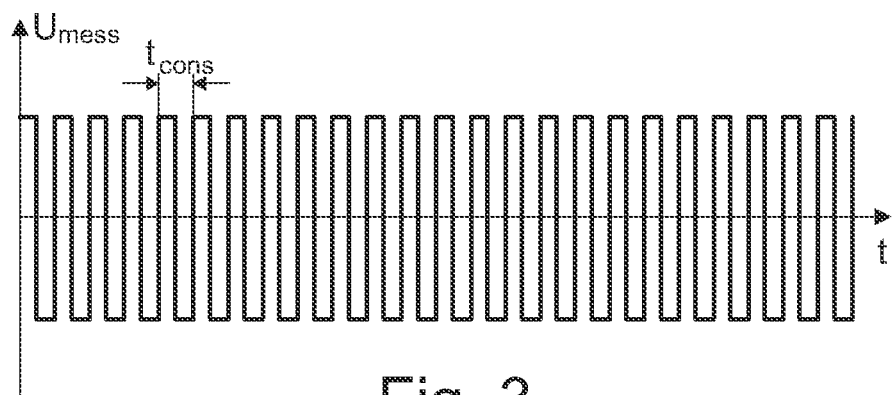
FIG. 3: shows the voltage profile of an AC measurement voltage $U_{mess\sim}$ of an example of embodiment.

FIG. 3 shows the time-wise profile of the AC measurement voltage $U_{mess\sim}$, which has a periodic time $t_{cons}$. Here it is advantageous if the periodic time $t_{cons}$ is selected such that a whole number multiple of impulse periods of the AC measurement voltage $U_{mess\sim}$ elapse in one measurement period $t_{var}$ of the DC measurement voltage $U_{mess=}$.

Figure 4:
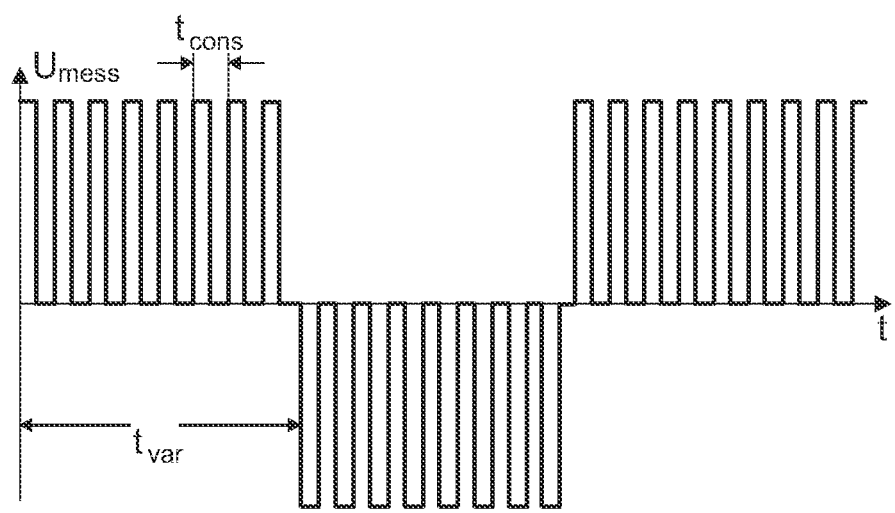
FIG. 4: shows the voltage profile of a total measurement voltage $U_{mess}$ of an example of embodiment.

The total measurement voltage $U_{mess}$ ensuing from the superposition of $U_{mess=}$ and $U_{mess\sim}$ represented in FIG. 2 and FIG. 3 is represented in FIG. 4. Here the DC measurement voltage $U_{mess=}$ is superposed on the AC measurement voltage $U_{mess\sim}$, whereby the amplitude of the DC measurement voltage $U_{mess=}$ corresponds exactly to the amplitude of the AC measurement voltage $U_{mess\sim}$, such that within one DC measurement period $t_{var}$ only positive amplitudes of the total measurement voltage $U_{mess}$ occur, and in a following DC measurement period $t_{var}$ only negative amplitudes occur.

Figure 5:
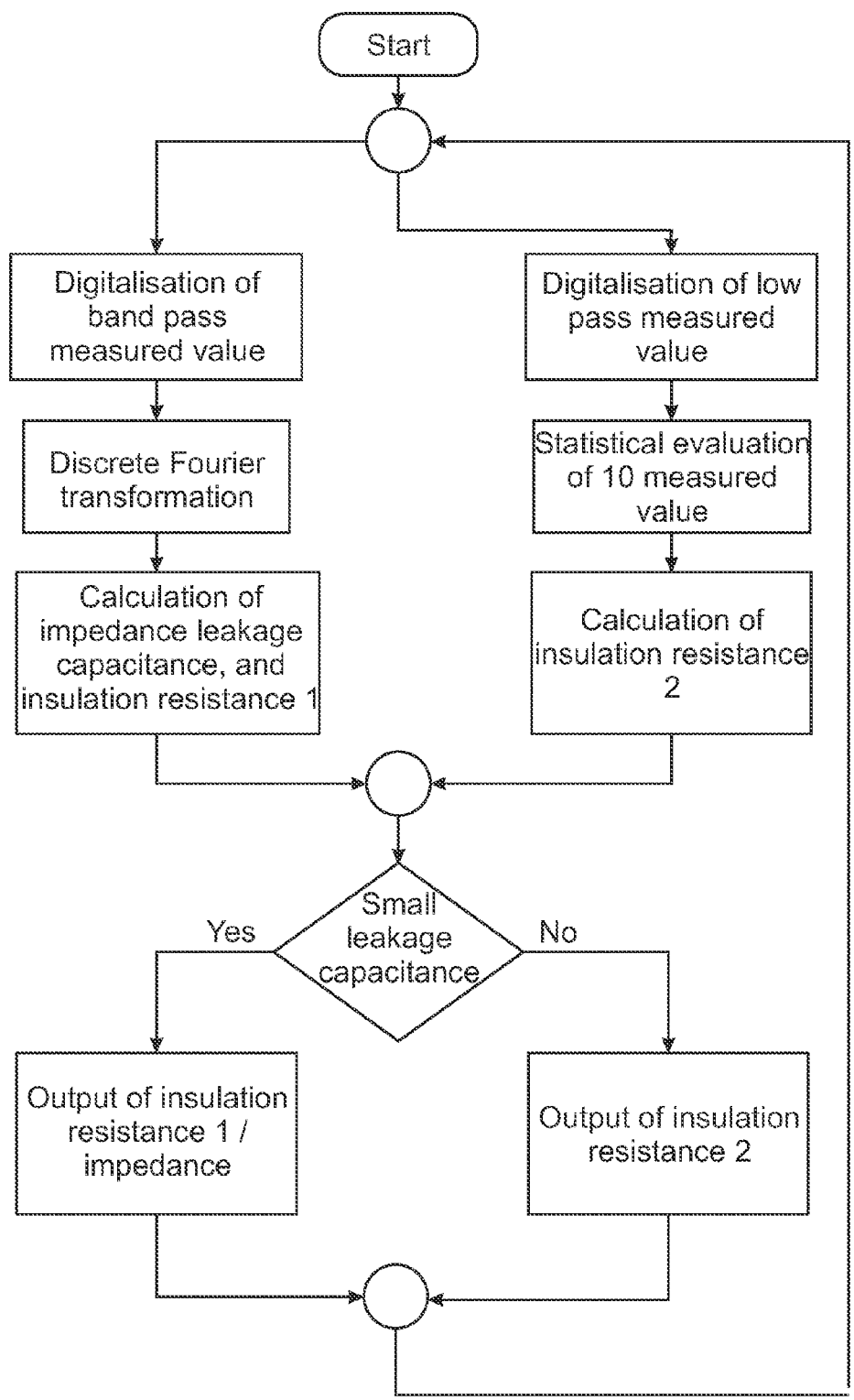
FIG. 5: shows a flow chart for an example of embodiment of the inventive method.

FIG. 5 shows a flow diagram of one embodiment of the inventive method. Firstly, a band-pass filtering and a low-pass filtering of the measured currents are executed, and subsequently a digitalisation, such that digitally measured current components $I_{mess=}$ and $I_{mess\sim}$ respectively are present. The AC component $I_{mess\sim}$ is transformed by means of a discrete Fourier transformation into the frequency domain, whereby in the frequency domain the impedance, the leakage capacitance $C_\sim$, and the insulation resistance $R_\sim$ (insulation resistance 1) can be determined. The digitalised value of the measured current $I_{mess=}$ is evaluated statistically over, for example, ten previously measured values, by means of a continuous averaging method, in order to mean out any measurement inaccuracies. From this the insulation resistance $R_=$ (insulation resistance 2) is then determined. A comparison between the two insulation resistances is then undertaken. If the calculation of the leakage capacitance $C_\sim$ indicates the presence of a small leakage capacitance, or differences conditioned by the system between the insulation resistances $R_=$ and $R_\sim$ point to a small leakage capacitance, then the AC insulation resistance $R_\sim$ (insulation resistance 1) and the impedance $Z_\sim$ are to be outputted as the insulation resistance of the network that is being monitored.

If the determination of the leakage capacitance $C_\sim$ indicates the presence of a high leakage capacitance $C_\sim$—where the term "high" relates to a network-specific leakage capacitance, as is usually present in such networks—then the DC-based insulation resistance is outputted. Then the method starts anew to execute cyclically, advantageously continuously, an integrated monitoring of the insulation status of the network.

Thus, in the case of small network leakage capacitances, the real part from the discrete Fourier transformation is used for the output of the insulation measured value. Depending on the application the value of the impedance can also be outputted as a measured value. In the case of larger leakage capacitances the insulation measured value is calculated from the voltage proportional to the final value of a measurement cycle, that is to say, it is the insulation measured value $R_=$ that is outputted.

Figure 6:
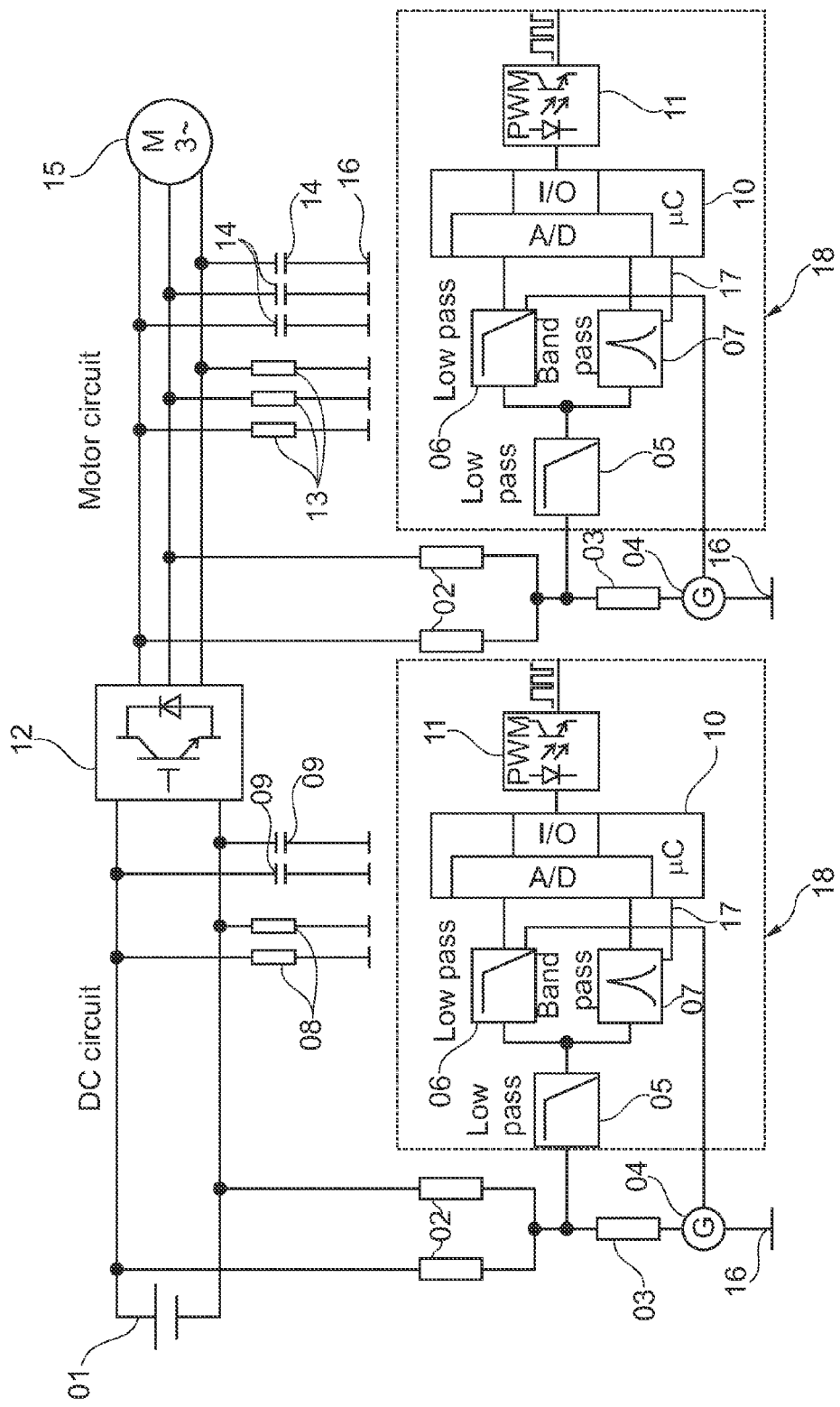
FIG. 6: shows a circuit diagram of an insulation measurement device for monitoring the insulation of the DC circuit and motor circuit in accordance with one example of embodiment.

FIG. 6 shows, in a motor converter circuit, the continuous monitoring both of the DC circuit by means of one individual insulation measurement unit 18 and also of the motor circuit with a separate individual insulation measurement unit 18. For this purpose an insulation measurement unit 18, already represented in FIG. 1, is connected with a coupling network, both in the DC circuit and also in the motor circuit. If the insulation measurement unit 18 represented in FIG. 1 is used, then if no energy transfer is taking place through the frequency converter, no insulation defects can be recorded on the motor side, i.e. in the motor circuit. Therefore the circuitry represented in FIG. 6 shows a second measurement unit 18 on the motor side, which operates independently from the insulation measurement unit 18 of the DC circuit, and which monitors continuously the insulation impedance and the insulation resistance of the motor circuit.

In order to prevent any mutual interference between the two measurement units 18, different frequencies, which have a sufficiently high signal-to-noise ratio relative to one another, are used for the pulsed measurement voltages that are generated by the impulse measurement voltage sources 04. The measurement frequency of the first unit is filtered out from the second unit as an interference frequency, and by this means no interference ensues in the recording of measured values by the two insulation measurement units.

Figure 7:
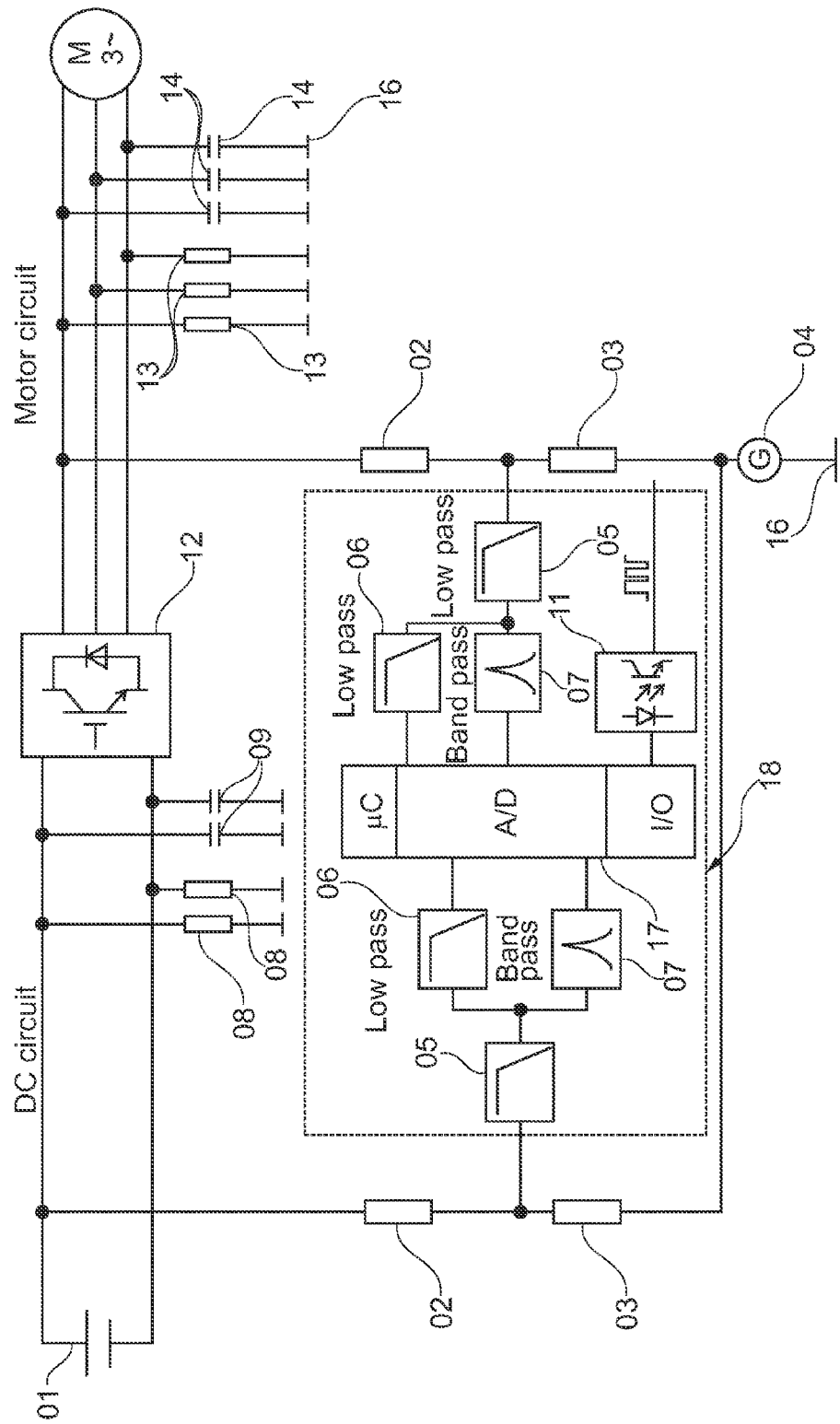
FIG. 7: shows an example of embodiment of an insulation measurement device for combined monitoring of the DC circuit and motor circuit.

Finally FIG. 7 shows a measurement unit 18, which can execute combined monitoring of the insulation conditions in both the DC circuit and also the motor circuit. For this purpose the insulation measurement unit 18 comprises a coupling network, which consists of a measuring resistance 03 and also a coupling resistance 02 for the DC circuit and a measuring resistance 03 and a coupling resistance 02 for the motor circuit. An individual impulse measurement voltage source 04 that is connected with the ground of the supply network generates a common total measurement voltage, $U_{mess}$, that is supplied through the coupling network to both the DC circuit and also the motor circuit. The insulation measurement unit 18 comprises for this purpose two separate filter cascades, in each case consisting of an upstream low-pass filter 05, a low-pass filter 06 to determine the DC measured current $I_{mess=}$ and also a band-pass filter 07 to determine an AC measured current $I_{mess\sim}$, which are subsequently converted from analogue to digital values and by means of a microcontroller 10 serve to determine the leakage capacitance 09 and the leakage resistance 08 of the DC circuit, and also at the same time the leakage resistance 13 and the leakage capacitance 14 of the motor circuit. By means of a discrete Fourier transformation the impedance value and also the insulation measured value and the leakage capacitance are determined in both the DC circuit and the motor circuit.

The impedance value is recorded very accurately, whereas, e.g. as a result of disturbances in the monitoring network, the leakage capacitance can be calculated with a lower accuracy, or can be erroneous. As a result of the redundant calculation of the insulation resistance by means of the impulse voltage method, it is possible with the aid of the impedance value to determine the leakage capacitance independently by a second route. By comparing the two measured values it is possible to evaluate the quality of the leakage capacitance measurement. Furthermore it is advantageous to compare the two differently derived insulation measured values $R_=$ and $R_\sim$ with each other and, in the event of a certain percentage deviation between the measured values, to identify them as invalid, and/or above a certain number of invalid comparisons of measured values, to output an error signal.

The insulation measurement unit represented in FIG. 7 can serve the purpose of determining insulation defects on the motor side, even if no energy transfer is taking place through the frequency converter. Here, compared with the device represented in FIG. 6, it has the advantage of requiring only a single impulse measurement voltage source 04 as well as a reduced level of hardware within the insulation measurement unit 18. Thus only one microcontroller 10 and one measurement voltage source 04 are required. The measurement voltage source 04 generates a signal with two superposed frequencies, to which the band-pass filters 07 of the DC circuit and the motor circuit are tuned in each case. A further advantage compared with the circuitry represented in FIG. 6 consists in the fact that the impulse measurement method can be used free of interference and without the risk of mutual interference, because only one impulse measurement voltage source is present, and there is no need to fear interference from a second source.

The invention claimed is:

1. A method for monitoring the insulation of an unearthed DC voltage network or an unearthed AC voltage network, or an unearthed DC voltage network and an unearthed DC-AC voltage network, comprising the steps of:
   (a) generating a DC measurement voltage $U_{mess=}$ connected on one side to ground for a predeterminable measurement period $t_{var}$;
   (b) generating and superpositioning at least one AC measurement voltage $U_{mess\sim}$ connected to ground with a periodic time $t_{cons}$ onto the DC measurement voltage $U_{mess=}$ for the purpose of forming a total measurement voltage $U_{mess}$;
   (c) introducing the total measurement voltage $U_{mess}$ into the voltage network to be monitored; and
   (d) determining an insulation resistance $R_=$ from the DC measurement voltage $U_{mess=}$ and an insulation impedance $Z_\sim$ from the AC measurement voltage $U_{mess\sim}$;

(e) measuring a total measured current $I_{mess}$ generated by the total measurement voltage $U_{mess}$, when determining the insulation resistance $R_=$ and the insulation impedance $Z_\sim$;

(f) dividing the total measured current $I_{mess}$ into a DC measured current $I_{mess=}$ and an AC measured current $I_{mess\sim}$;

(g) determining the insulation resistance $R_=$ based on the DC measured current $I_{mess=}$ and determining the insulation impedance $Z_\sim$ based on the AC measured current $I_{mess\sim}$;

(h) determining an insulation resistance $R_\sim$ and a leakage capacitance $C_\sim$ from the insulation impedance $Z_\sim$; and (i) outputting the insulation resistance $R_\sim$ as an insulation resistance of the voltage network when there is a voltage network-specific small leakage capacitance and outputting the insulation resistance $R_=$ as an insulation resistance of the voltage network, when there is a large leakage capacitance.

2. The method in accordance with claim 1, further including the additional step:

(j) repeating steps (a) (i) with variation of the DC voltage measurement period $t_{var}$ or variation of the periodic time $t_{cons}$, or variation of the DC voltage measurement period $t_{var}$ and the variation of the periodic time $t_{cons}$, until $R_\sim$ and $R_=$ come to within a predeterminable tolerance range of each other, when there is a difference between the insulation resistances $R_\sim$ and $R_=$ that exceeds predetermined tolerances.

3. The method in accordance with claim 1, wherein the measurement of the total current $I_{mess}$, or the measurement current components $I_{mess\sim}/I_{mess=}$, is a digitalisation of the measured values.

4. The method in accordance with claim 1, wherein the division of the total measured current $I_{mess}$ into the DC measured current $I_{mess=}$ comprises at least one low-pass filtering of the total measured current $I_{mess}$ by a low-pass filter.

5. The method in accordance with claim 1, wherein the division of the total measured current $I_{mess}$ into the AC measured current $I_{mess\sim}$ comprises a band-pass filtering of the total measured current $I_{mess}$ by means of a band-pass filter.

6. The method in accordance with claim 4, wherein a bandwidth and a central frequency of the band-pass filter or a cut-off frequency of the low-pass filter, or a central frequency of the band-pass filter and a cut-off frequency of the low-pass filter can be adjusted electronically.

7. The method in accordance with claim 1, further including the additional step:

(j) executing steps (a)-(i) cyclically with adjustable time intervals between the measurements.

8. The method in accordance with claim 7, further including the additional step:

(d') determining the insulation resistance $R_=$ via a statistical evaluation of the measured values $R_=$, $I_{mess=}$ or $U_{mess=}$, or a statistical evaluation of the measured values $R_=$, $I_{mess=}$ and $U_{mess=}$, over a plurality of measurement cycles, wherein the plurality of measurement cycles are executed one after another with measurement periods $t_{var}$, and wherein the statistical evaluation is a continuous formation of an average value.

9. The method in accordance with claim 7, further including the additional step:

(k) combating the leakage capacitance and disturbances of the voltage network by variably adjusting the measurement period $t_{var}$ for each measurement cycle.

10. The method in accordance with claim 1, wherein the measurement period $t_{var}$ is determined from a derived insulation impedance $Z_\sim$, in accordance with the equation $t_{var}=n*R_i*C_\sim$, where $R_i$ is the internal resistance of the insulation measurement unit, and $n \geq 3$.

11. The method in accordance with claim 1, wherein the measurement period $t_{var}$ is at least one second.

12. The method in accordance with claim 1, wherein the measurement period $t_{var}$ is between one and five seconds in length.

13. The method in accordance with claim 1, wherein the measurement period $t_{var}$ is a whole number multiple of the periodic time $t_{cons}$.

14. The method in accordance with claim 13, wherein the periodic time $t_{cons}$ is approximately $t_{var}/10$.

15. The method in accordance with claim 1, wherein the periodic time $t_{cons}$ is approximately 0.1 seconds.

16. The method in accordance with claim 1, wherein the periodic time $t_{cons} < 2\pi C_\sim R_\alpha$, wherein $R_\alpha$ is the response value of an insulation measurement unit that measures the insulation values.

17. The method in accordance with claim 3, wherein the determination of the insulation impedance $Z_\sim$ comprises a discrete Fourier transformation (DFT/FFT), wherein at least the determination of a insulation impedance, a leakage capacitance $C_\sim$ and a insulation resistance $R_\sim$ is undertaken in the frequency domain.

18. The method in accordance with claim 1, including the additional step:

(h') determining the leakage capacitance $C_\sim$ by means of the measured insulation impedance $Z_\sim$ and the insulation resistance $R_=$ in accordance with $$C_\sim = \frac{1}{\omega}\sqrt{\frac{1}{Z_\sim^2} - \frac{1}{R_=^2}},$$

wherein $\omega$ is the angular frequency of the alternating circuit.

19. A method in accordance with claim 1 for monitoring a voltage network with a dynamically alterable voltage, the method including the steps of:

(1) providing a voltage network with a dynamically alterable voltage including a converter circuit for the dynamic operation of a single-phase, or a three-phase AC motor;

(2) providing a DC circuit coupled with a motor circuit via a converter; and (3) monitoring the insulation of the voltage network in accordance with the method of claim 1.

20. The method in accordance with claim 19, wherein the voltage network is an electric motor drive.

21. The method in accordance with claim 20, wherein the electric motor drive is also operable as a generator, and wherein the method includes the additional steps of
(2') transferring energy occurs from a motor side to a DC side; and
(3') monitoring the insulation in accordance with the method of claim 1 when the motor is operating in both a motor mode and a generator mode.

22. The method according to claim 19, the method further including the additional step:
(4) monitoring the insulation resistance, or the leakage impedance of the DC circuit, or the leakage impedance of the single-phase or the three-phase AC motor circuit, or the leakage impedance of the DC circuit and the leakage impedance of the single-phase or the three-phase AC motor circuit.

23. The method in accordance with claim 19, the method further including the additional step:
(4) selecting the periodic time $t_{cons}$ of the respective AC measurement voltages $U_{mess\sim}$ so that the measurement signals do not interfere with one another when there is simultaneous monitoring of the insulation resistances, or the insulation impedance, or the insulation resistances and the insulation impedance in the DC and motor circuits.

24. The method in accordance with claim 19, the method further including the additional step:
(2') coupling the total measurement voltage $U_{mess}$ into a plurality of DC paths between a DC source and a converter via a plurality of coupling resistances.

25. The method in accordance with claim 19, the method further including the additional step:
(2') coupling the total measurement voltage $U_{ness}$ into at least two phases of the three-phase motor circuit via at least two coupling resistances.

26. The method in accordance with claim 19, the method further including the additional step:
(2') coupling the total measurement voltage $U_{ness}$ via at least two coupling resistances, wherein a first coupling resistance is coupled into the DC circuit, and a second coupling resistance is coupled into the motor circuit, and wherein at least the insulation resistance of both circuits can be determined, when no energy transfer is taking place through the converter.

27. A device for the execution of the method in accordance with claim 1, the device comprising:
(i) an impulse measurement voltage source, connected on one side with ground, that generates the total measurement voltage $U_{mess}$;
(ii) at least one coupling network, comprising at least one coupling resistance and one measuring resistance, coupling the total measurement voltage $U_{mess}$ into the voltage network; and
(iii) an insulation measurement unit operably connected for determining the leakage impedance and the insulation resistance,
wherein
the impulse measurement voltage source is constructed to generate the total measurement voltage $U_{mess}$ that ensues from a superposition of the DC measurement voltage $U_{mess=}$ with a predeterminable measurement period $t_{var}$, and at least one AC measurement voltage $U_{mess\sim}$ with the periodic time $t_{cons}$;
and wherein the insulation measurement unit is constructed to determine an insulation resistance $R_=$ based on the DC measurement voltage $U_{mess=}$ and an insulation impedance $Z_\sim$ based on the AC measurement voltage $U_{mess\sim}$.

28. The device in accordance with claim 27, wherein the insulation measurement unit comprises a plurality of filter elements that are configured to divide a total current $I_{mess}$ measured on the measuring resistance into a DC measured current $I_{mess=}$ and an AC measured current $I_{mess\sim}$, wherein the insulation resistance $R_=$ is determined based on the DC measured current $I_{mess=}$ and the insulation impedance $Z_\sim$ is determined based on the AC measured current $I_{mess\sim}$.

29. The device in accordance with claim 28, wherein the plurality of filter elements comprise at least one low-pass filter for deriving the insulation resistance $R_=$ and one band-pass filter for deriving the insulation impedance $Z_\sim$.

30. The device in accordance with claim 27, wherein the plurality of filter elements comprise one upstream low-pass filter that filters out interference signals.

31. The device in accordance with one of the claim 27, wherein at least some parts of the filter elements are electronically adjustable under operational conditions, so that frequency parameters are adjustable.

32. The device in accordance with claim 27, wherein the insulation measurement unit comprises at least one A/D-converter, in order to convert the current and/or voltage values measured on the measuring resistance to digital forms.

33. The device in accordance with claim 32, wherein the insulation measurement unit comprises at least one discrete Fourier transformation (FFT/DFT) processing unit, in order to transform at least the values measured for the derivation of the leakage impedance $Z_\sim$ into the frequency domain.

34. The device in accordance with claim 27, wherein the insulation measurement unit comprises a microcontroller that is configured to undertake signal processing of the measurement voltage value or the measurement current value, or the measurement voltage and measurement current values, and to determine the derived insulation resistance $R_=$ and the derived insulation impedance $Z_\sim$, or the insulation resistance $R_\sim$ and the leakage capacitance $C_\sim$.

35. The device in accordance with claim 27, wherein the insulation measurement unit comprises an I/O-interface, wherein, by means of an optical coupler, pulse-width modulated (PWM-modulated) data of the insulation measurement unit is outputted.

36. The device in accordance with claim 27, wherein the insulation measurement unit comprises an I/O-interface, wherein the I/O-interface is disposed to transfer digital data to a CAN interface or to a LIN interface.

37. The method in accordance with claim 1, wherein the method for monitoring the insulation is executed in a continuous cyclical manner, with adjustable time intervals between the measurements.

38. The method in accordance with claim 19, wherein the method is applied in a hybrid vehicle to monitor the insulation.

39. The device in accordance with claim 27, wherein the frequency parameters are selected from the group consisting of a cut-off frequency a central frequency, and a bandwidth frequency.

\* \* \* \* \*